United States Patent
Choi et al.

(10) Patent No.: US 11,692,260 B2
(45) Date of Patent: Jul. 4, 2023

(54) METAL-OXIDE SEMICONDUCTOR EVAPORATION SOURCE EQUIPPED WITH VARIABLE TEMPERATURE CONTROL MODULE

(71) Applicant: T.O.S CO., Ltd., Osan-si (KR)

(72) Inventors: Bum Ho Choi, Goyang-si (KR); Seung Soo Lee, Gyeonggi-do (KR); Yeong Geun Jo, Osan-si (KR); Yong Sik Kim, Suwon-si (KR)

(73) Assignee: T.O.S. CO., LTD., Gyeonggi-do (KR)

( * ) Notice: Subject to any disclaimer, the term of this patent is extended or adjusted under 35 U.S.C. 154(b) by 0 days.

(21) Appl. No.: 17/105,743

(22) Filed: Nov. 27, 2020

(65) Prior Publication Data
US 2021/0285088 A1 Sep. 16, 2021

(30) Foreign Application Priority Data
Mar. 11, 2020 (KR) .......... 10-2020-0030215

(51) Int. Cl.
*C23C 14/08* (2006.01)
*B01L 3/04* (2006.01)
(Continued)

(52) U.S. Cl.
CPC .......... *C23C 14/08* (2013.01); *B01L 3/04* (2013.01); *B01L 7/54* (2013.01); *C23C 14/243* (2013.01); *C23C 14/30* (2013.01); *C23C 14/54* (2013.01)

(58) Field of Classification Search
CPC .................................................. C23C 14/243
See application file for complete search history.

(56) References Cited

U.S. PATENT DOCUMENTS 3,684,557 A * 8/1972 Kienel ............... H01J 37/302
219/121.28
5,253,266 A * 10/1993 Knodle, III ........ C30B 23/066
118/726
(Continued)

FOREIGN PATENT DOCUMENTS

JP    H09-143694 A    6/1997
JP    2015-067847 A    4/2015
(Continued)

OTHER PUBLICATIONS

Korean Office Action Corresponding to 10-2020-0030215 dated Apr. 13, 2021.
(Continued)

*Primary Examiner* — Keath T Chen
(74) *Attorney, Agent, or Firm* — Finch & Maloney PLLC

(57) ABSTRACT

A metal-oxide electron-beam evaporation source including a variable temperature control device according to the present invention includes: a crucible configured to store a deposition material which is formed of a metal oxide and over which an electron beam is directly scanned; N heating units provided in an outer portion of the crucible, dividing the crucible into N regions, and provided for N regions, respectively; and a control unit configured to control the N heating units so that a temperature of an upper region of the crucible is maintained to be higher than that of a lower region of the crucible to reduce a temperature difference between a region over which the electron beam is scanned and a region over which the electron beam is not scanned.

1 Claim, 5 Drawing Sheets

(51) Int. Cl.
    *C23C 14/54*     (2006.01)
    *C23C 14/24*     (2006.01)
    *C23C 14/30*     (2006.01)
    *B01L 7/00*     (2006.01)

(56) References Cited

U.S. PATENT DOCUMENTS

| | | | | |
|---|---|---|---|---|
| 5,418,003 | A * | 5/1995 | Bruce | C23C 14/24 |
| | | | | 427/126.3 |
| 2002/0153247 | A1 * | 10/2002 | Gibson | C23C 14/044 |
| | | | | 118/715 |
| 2008/0191153 | A1 * | 8/2008 | Marganski | C23C 14/48 |
| | | | | 134/107 |
| 2009/0014316 | A1 * | 1/2009 | Mitchell | C23C 14/26 |
| | | | | 204/192.1 |
| 2013/0189424 | A1 * | 7/2013 | Okazaki | H01M 10/04 |
| | | | | 118/726 |
| 2019/0185990 | A1 * | 6/2019 | Zhao | C23C 14/543 |
| 2020/0377991 | A1 * | 12/2020 | Morishima | H01L 51/0021 |

FOREIGN PATENT DOCUMENTS

| | | | | |
|---|---|---|---|---|
| JP | 2020-193368 | A | 12/2020 | |
| KR | 960015544 | * | 11/1996 | C23C 14/32 |
| KR | 10-2007-0025163 | A | 4/2007 | |
| KR | 10-2016-0035364 | A | 3/2016 | |
| KR | 10-2015-0123809 | A | 8/2019 | |

OTHER PUBLICATIONS

Japanese Office Action Corresponding to 2020-197378 dated Dec. 7, 2021.

\* cited by examiner

METAL-OXIDE SEMICONDUCTOR EVAPORATION SOURCE EQUIPPED WITH VARIABLE TEMPERATURE CONTROL MODULE

CROSS REFERENCE TO RELATED APPLICATION

This application claims the benefit of Korean Patent Application No. 10-2020-0030215, filed on Mar. 11, 2020, entitled "Metal-Oxide semiconductor evaporation source equipped with variable temperature control module", which is hereby incorporated by reference in its entirety into this application.

BACKGROUND

Field

The present invention relates to a metal-oxide electron-beam evaporation source that prevents a crack by using a variable temperature control device.

Description of the Related Art

ZnO and ZnO-based compounds (AZO, IZO, IGZO, GZO, and the like) are materials that have been most extensively studied among metal-oxide semiconductors, and have already been used in a transparent electrode of an existing display panel, a channel layer of a thin film transistor for pixel driving, a transparent display, a transparent semiconductor element, a solar cell, and the like.

As widely known, main examples of a method for forming a ZnO-based metal-oxide semiconductor thin film include an evaporation technology in which heat or an electron beam is focused on a metal-oxide target for evaporation, a sputtering technology using a collision with an ionized source, and chemical vapor deposition using a chemical reaction between injected gases.

Among the above methods, the evaporation technology and sputtering technology are technologies of applying heat or kinetic energy to a raw material in a solid state from the outside to cause a phase transition of the raw material into a gaseous state and depositing the raw material onto a substrate. On the other hand, the chemical vapor deposition is a technology of causing a phase transition of a raw material in a liquid state into a gaseous state or depositing a raw material in a gaseous state onto a substrate.

The above technologies each have advantages suitable for respective equipment. In addition, in all of the above technologies, an n-type ZnO layer is formed, and a method, in which a donor dopant is formed by, for example, simultaneously injecting elements such as In, Al, and Ga in order to improve characteristics of an n-type ZnO metal-oxide semiconductor thin film, to thereby improve electrical characteristics as an n-type semiconductor, is adopted.

Among the methods for forming a ZnO thin film, the evaporation technology is a method of relatively simply depositing a ZnO layer with low manufacturing costs, and includes a thermal evaporation technology in which heat is applied as energy, and an electron-beam evaporation technology in which an electron beam is used.

In particular, the electron-beam evaporation technology is preferred over the thermal evaporation technology in terms of efficiency in using a deposition material, deposition speed control, and the like, and here, a ZnO raw material in a powder form is mainly used. ZnO powder is suitable to be used as a deposition raw material to deposit a ZnO thin film onto a substrate having a small area of 2 inches or multiple substrates having small areas.

However, recently, in order to improve productivity, the size of a substrate has increased to 4 inches and 6 inches, and the number of substrates on which deposition is performed at one time has also increased to 50 or more. Therefore, the ZnO powder is not suitable to be used as a deposition raw material to form a thin film on a large-sized substrate.

Since thin film uniformity or the like on a large-sized substrate, which is essential to improve a thin film deposition process, is not sufficient for manufacturing elements, the number of chips manufactured per unit area significantly decreases. In order to solve such a problem, it is preferable to use a ZnO raw material in a target form prepared by using powder sintering, which is similar to a deposition raw material used in the sputtering technology. In a case of using such a raw material in a target form, it is possible to improve deposition uniformity on a large-sized substrate, efficiency in using a raw material, or the like.

However, in a case of using an oxide target that is subjected to powder sintering, the oxide has a very low thermal conductivity, and due to the low thermal conductivity of the oxide, thermal stress generated by a temperature difference between a region over which the electron beam is scanned and a region over which the electron beam is not scanned causes cracks, which is problematic.

SUMMARY

An object of the present invention is to provide a metal-oxide electron-beam evaporation source including a variable temperature control device, which is capable of preventing a crack from being generated due to thermal stress applied to a deposition material formed of a metal oxide, the thermal stress being generated by a large temperature difference between a region over which an electron beam is scanned and a region over which the electron beam is not scanned.

According to an exemplary embodiment of the present invention, a metal-oxide electron-beam evaporation source including a variable temperature control device includes: a crucible storing a deposition material which is formed of a metal oxide and over which an electron beam is directly scanned; N heating units provided in an outer portion of the crucible, dividing the crucible into N regions, and provided for the N regions, respectively; and a control unit controlling the N heating units so that a temperature of an upper region of the crucible is maintained to be higher than that of a lower region of the crucible to reduce a temperature difference between a region over which the electron beam is scanned and a region over which the electron beam is not scanned.

The N heating units may include: a first heating unit that is provided on an upper side of the outer portion of the crucible and heats a first region; a second heating unit that is provided on a lower side of the outer portion of the crucible and heats a second region; and a third heating unit that is provided in a lower surface of the crucible and heats a third region.

The control unit may control the N heating units so that a temperature difference between the N regions is a set temperature or less.

The metal-oxide electron-beam evaporation source may further include an examination unit examining a changing shape of the deposition material formed of the metal oxide when the electron beam is scanned, wherein the control unit controls the N heating units so that a temperature of each of the N regions changes depending on the changing shape of the deposition material formed of the metal oxide.

The metal-oxide electron-beam evaporation source may further include a pocket which surrounds the outer portion of the crucible and in which the N heating units and the control units are provided.

DETAILED DESCRIPTION

Hereinafter, preferred exemplary embodiments of the present invention will be described in more detail with reference to the accompanying drawings. The exemplary embodiments of the present invention may be modified in many different forms and the scope of the present invention should not be construed to be limited to the following exemplary embodiments. Rather, these exemplary embodiments are provided to describe the present invention in more detail for those skilled in the art to which the present invention pertains.

Figure 1:
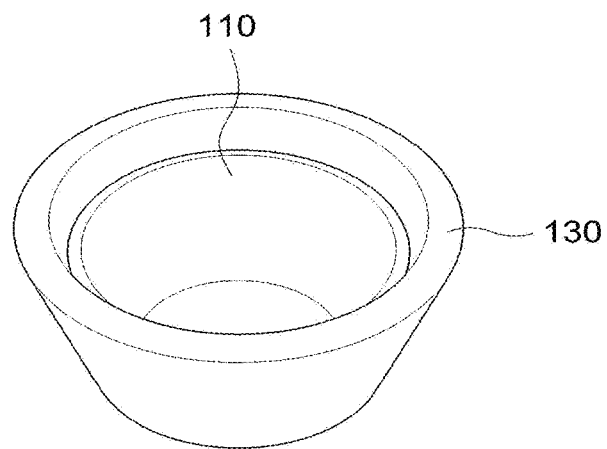
FIGS. 1 and 2 are diagrams for describing a metal-oxide electron-beam evaporation source including a variable temperature control device according to an exemplary embodiment of the present invention.
Figure 1:
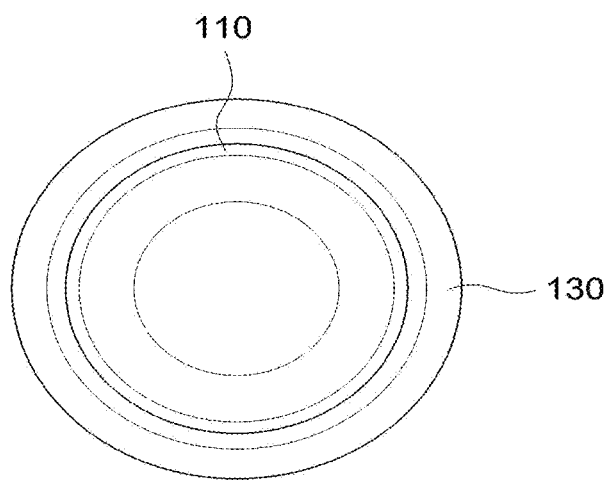
Figure 2:
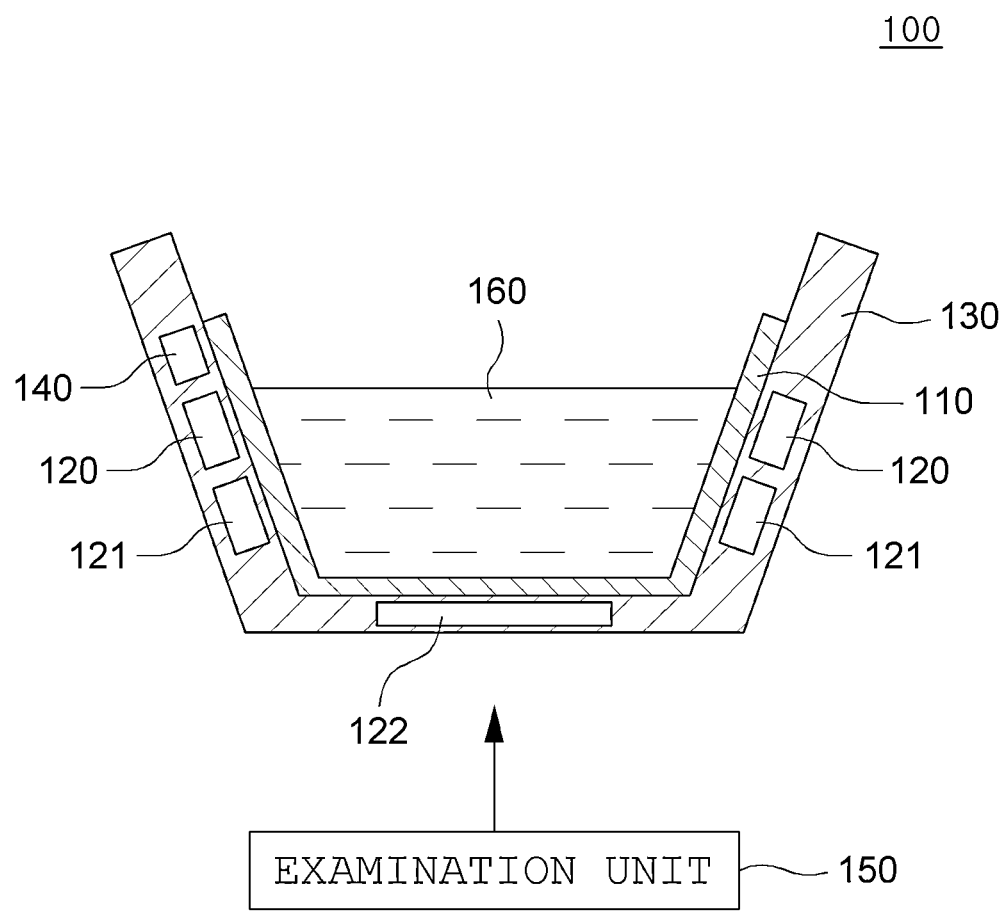
Figure 3:
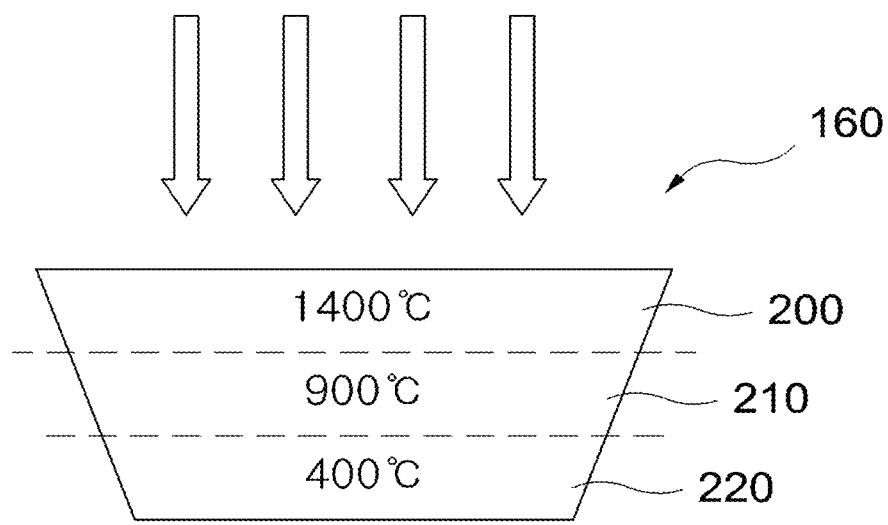
FIGS. 3 and 4 are diagrams for describing a phenomenon in which a crack is generated due to a temperature difference between a region over which an electron beam is scanned and a region over which the electron beam is not scanned.
Figure 4:
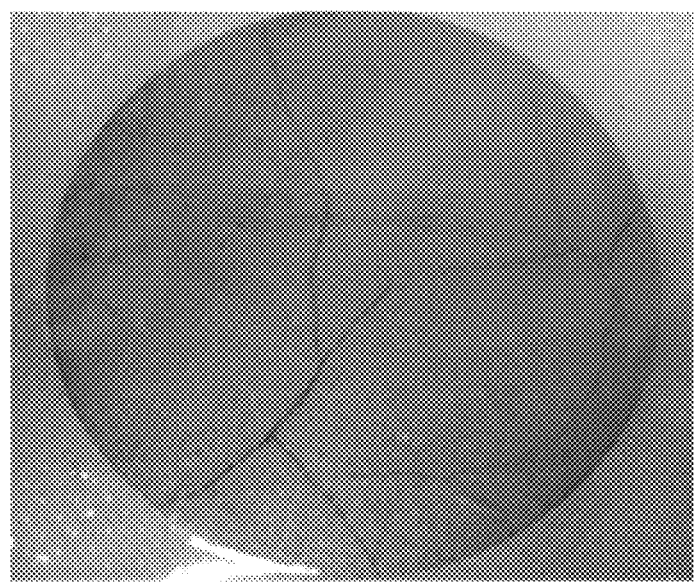

FIGS. 1 and 2 are diagrams for describing a metal-oxide electron-beam evaporation source including a variable temperature control device according to an exemplary embodiment of the present invention, and FIGS. 3 and 4 are diagrams for describing a phenomenon in which a crack is generated due to a temperature difference between a region over which an electron beam is scanned and a region over which the electron beam is not scanned.

Referring to FIGS. 1 and 2, a metal-oxide electron-beam evaporation source 100 including a variable temperature control device includes a crucible 110, N heating units 120, 121, and 122, a pocket 130, a control unit 140, and an examination unit 150.

The crucible 110 may store a deposition material (metal-oxide target) 160 which is formed of a metal oxide and over which an electron beam is directly scanned.

In a case of electron-beam evaporation using the metal-oxide target 160 that is subjected to powder sintering, sublimation, in which the metal-oxide evaporation target 160 having a cylindrical disc shape is irradiated with an electron beam to cause a phase transition from a solid state to a gaseous state without passing through a liquid state, is applied. Here, the temperature of a region of the metal-oxide target over which the electron beam is scanned may be 1200° C. to 1500° C.

The deposition material (metal-oxide target) 160 formed of the metal oxide may be a zinc-oxide-based metal oxide semiconductor material such as ZnO, AZO, IZO, IGZO, or GZO, or a material such as titanium oxide ($TiO_2$), tantalum oxide ($TaO_x$), or zirconium oxide ($ZrO_2$).

The N heating units 120, 121, and 122 may be provided in an outer portion of the crucible 110, may divide the crucible into N regions, and may be provided for the N regions, respectively. For example, the N heating units 120, 121, and 122 include a first heating unit 120 that is provided on an upper side of the outer portion of the crucible 110 and heats a first region, a second heating unit 121 that is provided on a lower side of the outer portion of the crucible 110 and heats a second region, and a third heating unit 122 that is provided in a lower surface of the crucible 110 and heats a third region.

In the present exemplary embodiment, a case where the number of regions is three and the number of heating units 120, 121, and 122 is three is described. However, the number of regions and the number of heating units are not limited thereto, and may be variously changed.

The shape of the heating units 120, 121, and 122 may be a coil shape, a rectangular shape, a circular shape, a hexagonal shape, or the like, and may preferably be a honeycomb hexagonal shape. However, the shape of the heating units 120, 121, and 122 may be selected depending on the type of metal-oxide target material.

The material of the heating units 120, 121, and 122 may be a material of which the temperature may be controlled between 300° C. and 1500° C., such as tungsten (W), molybdenum (Mo), platinum (Pt), chromium (Cr), zirconium (Zr), tantalum (Ta), titanium (Ti), silicon-carbide (SiC), a stainless alloy-based (SUS-based) material, or the like. Preferably, tungsten (W), molybdenum (Mo), tantalum (Ta), titanium (Ti), and silicon-carbide (SiC) may be used.

The pocket 130 may surround the outer portion of the crucible 110, and the N heating units 120, 121, and 122, and the control unit 140 may be provided in the pocket 130.

Referring to FIGS. 3 and 4, when the electron beam is scanned on the deposition material (metal-oxide target) 160 formed of the metal oxide, for example, the temperature of an upper region 200 may be 1400° C., the temperature of a middle region 210 may be 900° C., and the temperature of a lower region 220 may be 400° C. Alternatively, in the upper region 200, there may be a temperature difference between a region over which the electron beam is directly scanned or a region over which the electron beam is not scanned.

As such, in a case where the temperature difference between the region over which the electron beam is directly scanned or the region over which the electron beam is not scanned is large, a large thermal stress may be generated.

As illustrated in FIG. 4, when such a large thermal stress is generated, a crack is generated in the deposition material (metal-oxide target) 160 formed of the metal oxide.

The control unit 140 may control the N heating units 120, 121, and 122 so that the temperature of the upper region is maintained to be higher than that of the lower region. The control unit 140 may be attached to an outer side of the crucible 110, may be provided in the pocket 130, or may be separately provided at the outside.

For example, the control unit 140 may control three heating units 120, 121, and 122 so that a temperature difference between respective three regions is a set temperature (300° C.) or lower. For example, the control unit 140 may control three heating units 120, 121, and 122 so that a temperature difference between three heating units 120, 121, and 122 is 300° C. or lower.

As such, in a case where the temperature difference between three regions is 300° C. or lower, a large thermal stress is not generated. Therefore, as the control unit 140 performs a temperature control so that the temperature difference is 300° C. or lower, it is possible to prevent a crack of the metal-oxide target 160.

The examination unit 150 may examine the changing shape of the deposition material 160 formed of the metal oxide when the electron beam is scanned. For example, the examination unit 150 may be various devices capable of examining a shape change, such as a level sensor (for example, a laser sensor) capable of measuring a height change of the deposition material 160 formed of the metal oxide, and an image sensor capable of examining a shape change by obtaining an image.

The control unit 140 may control the N heating units so that the temperature of each of the N regions changes depending on the changing shape of the deposition material 160 formed of the metal oxide.

Figure 5:
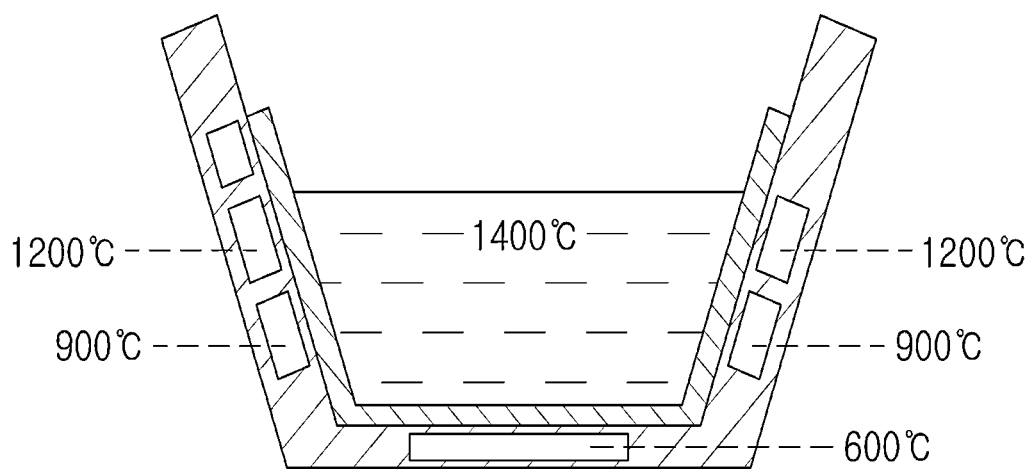
FIGS. 5, 6, and 7 are diagrams for describing a process in which a control unit controls heating units according to an exemplary embodiment of the present invention.
Figure 6:
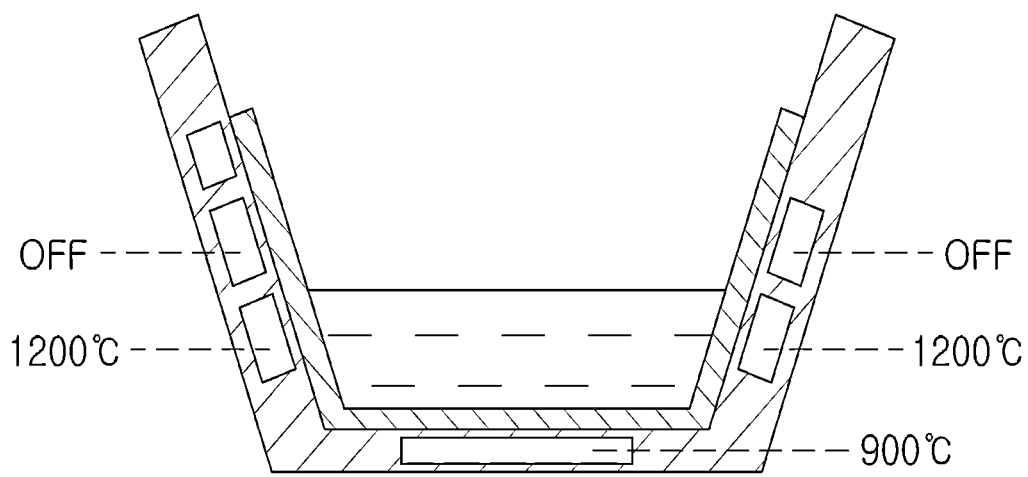
Figure 7:
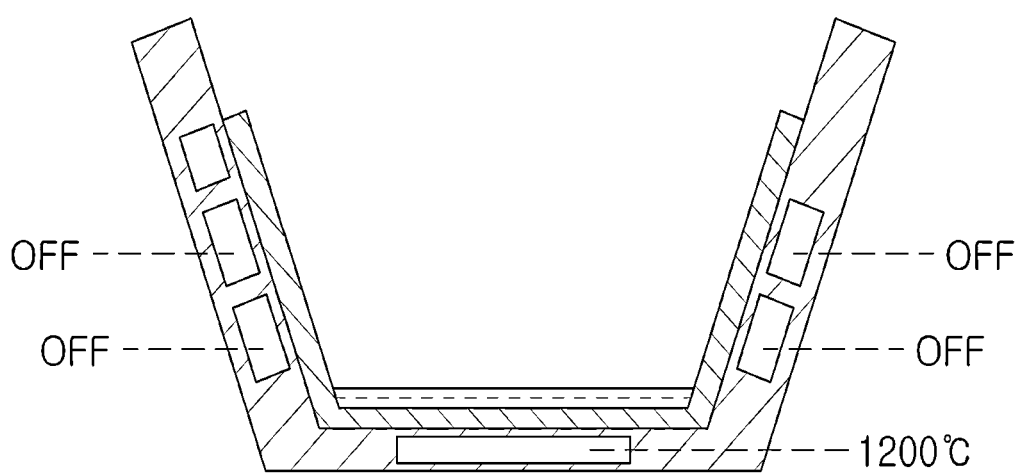

FIGS. 5, 6, and 7 are diagrams for describing a process in which the control unit controls the heating units according to an exemplary embodiment of the present invention.

The control unit 140 may control the N heating units so that the temperature of each of the N regions changes depending on the changing shape of the deposition material 160 formed of the metal oxide, the changing shape being measured by the examination unit 150.

Referring to FIGS. 1 and 5, in a case where the shape change of the deposition material 160 formed of the metal oxide hardly occurs, and the temperature of the deposition material 160 formed of the metal oxide is 1600° C., the temperature being measured when the electron beam is scanned, the control unit 140 may control the temperature of the first heating unit 120 to 1200° C., control the temperature of the second heating unit 121 to 900° C., and control the temperature of the third heating unit 122 to 600° C. In the present exemplary embodiment, a case of performing a control so that the temperature difference between regions is 400° C. or lower is described. However, the temperature difference between regions is not limited thereto, but may vary.

Referring to FIGS. 1 and 6, in a case where the measured shape of the deposition material 160 formed of the metal oxide changes so that the deposition material 160 is on a level below the first heating unit 120, the control unit 140 may turn off the first heating unit 120, control the temperature of the second heating unit 121 to 1200° C., and control the temperature of the third heating unit 122 to 900° C.

Referring to FIGS. 1 and 7, in a case where the measured shape of the deposition material 160 formed of the metal oxide changes so that the deposition material 160 is on a level below the second heating unit 121, the control unit 140 may turn off the first heating unit 120, turn off the temperature of the second heating unit 121, and control the temperature of the third heating unit 122 to 1200° C.

As such, the control unit 140 may control the N heating units so that the temperature of each of the N regions changes depending on the changing shape of the deposition material 160 formed of the metal oxide, the changing shape being measured by the examination unit 150. As a result, the temperature difference between the region over which the electron beam is scanned and the region over which the electron beam is not scanned can be reduced, and therefore, it is possible to prevent a crack from being generated in the deposition material 160 formed of a metal material.

In the present exemplary embodiment, only an example in which the control unit 140 controls the temperatures of the heating units depending on the measured shape change of the deposition material 160 formed of the metal oxide is described, but the control unit 140 may control the heating units according to various standards and situations.

According to an exemplary embodiment of the present invention, it is possible to prevent a large thermal stress by maintaining a temperature difference between the region over which the electron beam is scanned and the region over which the electron beam is not scanned at the set temperature or lower by using the heating unit included in each region, thereby preventing a crack of the metal-oxide target 160.

The above-described exemplary embodiments may be variously modified, and all or some of the exemplary embodiments may be selectively combined with each other. Further, the exemplary embodiments in the present specification are only for description, and are not limitative. In addition, it is to be understood by those skilled in the art to which the present invention pertains that various modifications may be made without departing from the scope of the technical idea of the present invention.

What is claimed is:

1. A metal-oxide electron-beam evaporation source including a variable temperature control device, the metal-oxide electron-beam evaporation source comprising:
    a crucible configured to store a deposition material which is formed of a metal oxide and over which an electron beam is directly scanned;
    N heating units provided in an outer portion of the crucible, dividing the crucible into N regions, and provided for the N regions, respectively;
    wherein the N heating units include a first heating unit that is provided on an upper side of the outer portion of the crucible and heats a first region;
        a second heating unit that is provided on a lower side of the outer portion of the crucible and heats a second region; and
        a third heating unit that is provided in a lower surface of the crucible and heats a third region;
    an examination unit configured to measure a changing shape of the deposition material formed of the metal oxide when the electron beam is scanned,
    a control unit communicating with the N heating units and the examination unit such that the examination unit communicates measured shape change to the control unit, the control unit being configured to control the N heating units based on the measured shape changes so that a temperature of an upper region of the crucible is maintained to be higher than that of a lower region of the crucible to reduce a temperature difference between a region over which the electron beam is scanned and a region over which the electron beam is not scanned, and controls the N heating units so that a temperature difference between the respective N regions is equal to or below a set temperature to reduce thermal stress of the deposition material and prevent a crack from being generated by a large temperature difference between the region over which the electron beam is scanned and the region over which the electron beam is not scanned,
    wherein the control unit is configured to control the temperature of the first heating unit to A ° C., control the temperature of the second heating unit to B ° C., control the temperature of the third heating unit to C ° C. and, control the N heating units so that a temperature difference between A ° C., B ° C. and C ° C. is equal to or below the set temperature,
    wherein when the measured shape of the deposition material formed of the metal oxide changes so that the deposition material is on a level below the first heating unit, the control unit turns off the first heating unit, controls the temperature of the second heating unit to A ° C., and control the temperature of the third heating unit to B ° C., wherein when the measured shape of the deposition material formed of the metal oxide changes so that the deposition material is on a level below the second heating unit, the control unit turns off the first heating unit, turns off the temperature of the second heating unit, and controls the temperature of the third heating unit to A ° C.

* * * * *